DOUBLE EPITAXIAL LAYER HIGH POWER, HIGH SPEED TRANSISTOR

Filed April 25, 1967

United States Patent Office 3,512,056

Patented May 12, 1970

3,512,056
DOUBLE EPITAXIAL LAYER HIGH POWER, HIGH SPEED TRANSISTOR

Ting Li Chu, Pittsburgh, Peter J. Kannam, Greensburg, and Donald A. Walczak, New Alexandria, Pa., assignors to Westinghouse Electric Corporation, Pittsburgh, Pa., a corporation of Pennsylvania Filed Apr. 25, 1967, Ser. No. 633,544
Int. Cl. H01l 7/36, 11/00
U.S. Cl. 317—235 6 Claims

ABSTRACT OF THE DISCLOSURE

This invention provides a high power, high speed transistor comprising two epitaxial layers of semiconductor material grown on a large area substrate. The growth of the two epitaxial layers is accomplished in one continuous process. Each epitaxial layer is grown to a desired thickness and has a specific type of semiconductivity having a preferred level of impurity concentration. A required third region of semiconductivity is formed by diffusion in one of the epitaxially grown layers of semiconductor material.

GOVERNMENT CONTRACT

The invention herein described was made in the course of, or under, a contract or subcontract thereunder with NASA. The contract is NAS 8–5335.

BACKGROUND OF THE INVENTION

Field of the invention

This invention relates to a double-epitaxial layer high power, high speed transistor and a process for producing the same.

Description of the prior art

High power, high speed transistors require stringent controls during manufacture. Multi-diffusion processing enables one to manufacture such devices but fails to produce a device wherein the regions of different type semiconductivity have a minimum thickness for the electrical characteristic desired and are free of contaminating impurities and crystal lattice defects. The formation of p-n junctions by epitaxial growth processes often produces junctions which are not well defined and free of stacking faults.

Epitaxial growth for large area semiconductor devices requires stringent substrate material preparation and selection. Heavy metal impurities such, for example, as aluminum and iron contamination from the slicing and lapping operation, must be removed prior to chemical polishing. These impurities if allowed to remain act as sites for polycrystalline inclusions during epitaxial growth operations. Special handling and loading procedures are followed to prevent mechanical damage and impurity contamination from the environment. The susceptor which supports the substrates is usually made of graphite and has to be cleaned and coated with a good grade of silicon carbide to effectively seal the susceptor and prevent any contamination of the epitaxially grown material from the impurities which are present in the graphite susceptor.

SUMMARY OF THE INVENTION

In accordance with the present invention there is provided a high amperage, high power three region semiconductor device comprising a body of semiconductor material having a major top surface, a first type semiconductivity, and a resistivity of from 0.001 to 0.1 ohm-centimeter; a first epitaxial layer of semiconductor material grown on the top surface of the body, the first epitaxial layer having the same type semiconductor material grown on the top surface of the body, the first epitaxial layer having the same type semiconductivity as the body, a thickness of from 12 to 20 microns and a resistivity of from 8 to 12 ohm-centimeter; a second epitaxial layer semiconductor material grown on the first epitaxial layer, the second epitaxial layer having a second type semiconductivity, a thickness of from 3 to 5 microns and a resistivity of from 0.08 to 0.15 ohm-centimeter and a first p-n junction formed at the interface between the two epitaxial regions; a diffused region of first type semiconductivity formed in the second epitaxial layer the diffused region having a thickness of from 3 to 4 microns and a resistivity of from 0.001 to 0.01 ohm-centimeter; and a second p-n junction formed at the interface between the two different regions of semiconductivity in the second epitaxial layer.

An object of this invention is to provide a high power, high speed transistor wherein each of two suitably doped epitaxial layers form respectively the collector and the base of the transistor and a suitably diffused region of one epitaxial layer forms the emitter of the transistor.

Another object of this invention is to provide a 100 amp high speed transistor wherein the collector and the base each are formed from a suitably doped epitaxial layer of semiconductor material.

Another object of this invention is to provide a process for making semiconductor devices incorporating reduced handling and loading procedures to minimize contamination of the devices.

A further object of this invention is to provide a process for growing two epitaxial layers of semiconductor material on a substrate wherein the epitaxial layers are free of defects such as polycrystalline inclusions and growth pyramids, and each epitaxial layer has a different type semiconductivity, and both layers are grown in one continuous growth process in the same furnace.

A further object of this invention is to provide a process for making a semiconductor device having two epitaxial grown layers of semiconductive material free of defects grown on a large area substrate wherein the substrate surface upon which epitaxial growth occurs is cleaned and the epitaxial layers are grown and suitably doped in one continuous process in the same furnace.

Other objects of this invention will, in part, be obvious and will, in part appear hereinafter.

DRAWINGS

For a better understanding of the nature and objects of this invention, reference should be had to the following drawings, in which.

DESCRIPTION OF THE INVENTION

Figure 1:
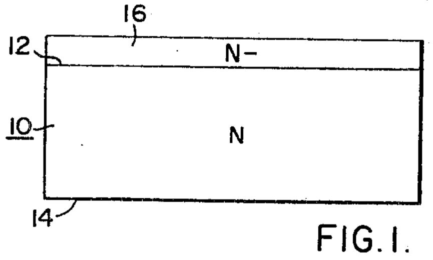
FIGS. 1, 2 and 3 are cross-sectional side views of a body of semiconductor material being processed in accordance with the teachings of this invention.

All high power, high speed transistors, except for a required amperage rating, have the same basic device structure. The amperage rating is determined by the length of the emitter edge. For a high power, high speed transistor having optimum electrical properties, minimum physical size and excellent reliability it has been found that the transistor should meet certain specific requirements.

One of the requirements is that the substrate employed in making the device must be substantially free of residual work damage from the preparation and handling procedures. The collector region of the transistors should have a thickness of from 12 to 20 microns and a resistivity of from 8 to 12 ohm-centimeters. The base region of the transistor should have a thickness of from 3 to 5 microns and a resistivity of from 0.08 to 0.15 ohm-centimeter. The emitter region of the transistor should have a thickness of from 3 to 4 microns and a resistivity of from 0.001 to 0.0008 ohm-centimeter.

To achieve these desired optimum requirements, a continuous process of in situ deposition of two suitably doped epitaxial layers is practiced on a suitable substrate to form the collectors and base regions. The emitter is formed by diffusion into a portion of the base region.

To more particularly describe the invention, and for no other purpose, we will describe the designing and fabrication of a 100 ampere, high power, high speed transistor.

The amperage rating of a high power, high speed transistor is determined by the bulk of the emitter region and the emitter edge length. For a 100 ampere device, we have determined that an emitter edge length of approximately 21 inches is necessary. This length for the emitter actually, will, along with the other requirements explained heretofore, produce some transistors capable of up to approximately 150 amperage rating.

With reference to FIG. 1, a body 10 of semiconductor material is prepared by suitable means such, for example, as by polishing and lapping to parallelism two major opposed surfaces 12 and 14.

The body 10 comprises a suitable semiconductor material such, for example, as silicon, silicon carbide, germanium, compounds of Group III and Group V elements and compounds of Group II and Group VI elements. In order to more fully describe the invention, and for no other purposes, the body 10 will be described as comprising silicon semiconductor material 12 mils in thickness after slicing and lapping and approximately 1 inch in diameter.

The body 10 of silicon has a resistivity of from 0.001 ohm-centimeter to 0.1 ohm-centimeter. Preferably, the body 10 has a resistivity of 0.01 ohm-centimeter and is of n-type semiconductivity.

The body 10 is chemically polished to remove work damage and to provide a surface conducive to defect-free epitaxial growth. Approximately 2.5 to 3.0 mils are therefore removed from each surface 12 and 14 of the body 10 to achieve this requirement.

The body 10 is placed in a horizontal epitaxial reactor furnace and heated to a temperature of from 1000° C. to 1200° C. A temperature of 1175±5° is preferred. Dry filtered hydrogen is provided as the furnace atmosphere for the body 10. Pure gaseous hydrogen chloride is then caused to flow through the furnace about the body 10. The flow is continued for approximately 10 minutes to remove a few microns of silicon thereby providing a clean surface for growing epitaxial material.

After treating the body 10 with hydrogen chloride, the reactor furnace atmosphere is flushed with hydrogen at the same temperature, for approximately 5 minutes. This flushing with hydrogen clears the system of any chloride by-products.

Upon conclusion of flushing the furnace with hydrogen, the reactor temperature is still retained at the same temperature as before. A gaseous reactant mixture of hydrogen, a silicon halide such, for example, as silicon tetrachloride, or a silicon hydride, such for example, as silane, and a suitable dopant, such, for example, as arsine or phosphine, is caused to flow through the reactor and across the surface 12 of the body 10 to produce a layer 16 of n-type semiconductivity material. The flow of the gaseous mixture is controlled to produce the epitaxial layer 16 of doped silicon from the reactant gas mixture at a rate of approximately 1 micron per minute. The process is continued until the epitaxial layer 16 of doped silicon, from 12 to 20 microns in thickness has been grown on the surface 12. A thickness of 20 microns is preferred.

The resistivity of the epitaxial layer 16 is from 8 to 12 ohm-centimeter. A resisitivity of 10 ohm-centimeter is preferred. The layer 16 preferably functions as the collector region for the final transistor device.

The reactor furnace atmosphere is again flushed with pure hydrogen for approximately 5 minutes to clear the reactor of residual by-products from the previous epitaxial growth process. In going from the process of producing high resistivity n-type material to the process of producing low resistivity p-type material, no flushing of the reactor is necessary. The temperature of the reactor is maintained at the previous temperature level.

Figure 2:
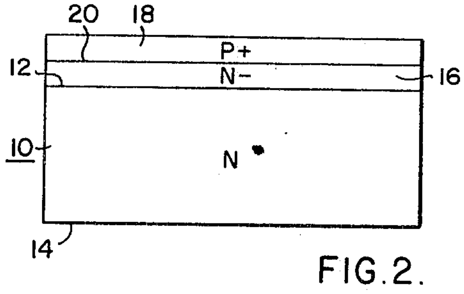

With reference to FIG. 2, a reactant gas mixture is then caused to flow through the reactor furnace and over the layer 16 grown on the body 10. The reactant gas mixture consists of hydrogen, a silicon halide—the same, or different, halide or a silane, from that previously employed—and a suitable dopant material such, for example, as diborane, to produce epitaxial material having p+ semiconductivity. The reactant gas mixture is controlled to produce an epitaxial growth of doped silicon at a rate of approximately 1 micron per minute. The dopant material is suitably controlled to produce an epitaxial growth having a resisitivity of from 0.08 to 0.15 ohm-centimeter. A resistivity of 0.1 ohm-centimeter is preferred. The process is continued until a layer 18 of epitaxially grown p+ semiconductivity type silicon, 3 to 5 microns in thickness, has been grown on the layer 16 of n-type epitaxial silicon. A preferred thickness is 3 microns. A p-n junction 20 is formed at the interface between the two layers 16 and 18.

Upon completion of the epitaxial growth of layer 18, the reactor is flushed with hydrogen for a sufficient time to cleanse the reactor of reactant products from the previous growth process. Hydrogen gas in caused to flow through the furnace as the body 10 is coled to room temperature. Upon cooling to room temperature the body 10 is immediately placed in an oxidation furnace.

Figure 3:
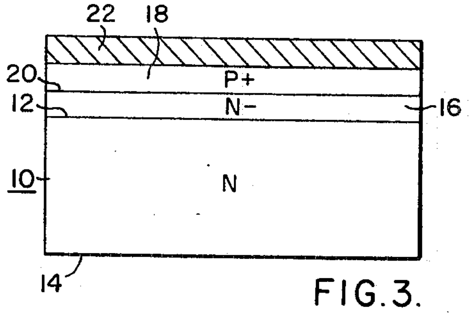

Referring now to FIG. 3, a layer 22 of silicon oxide, approximately 3,000 to 10,000 angstroms in thickness, is grown on the layer 18. The layer 22 is obtained by depositing a layer of silicon on the epitaxial layer 18 from the thermal reduction of a gaseous mixture of hydrogen and a silicon halide and oxidizing the resulting layer of silicon by passing oxygen saturated with water for approximately 1 hour through the furnace and about the body 10 heated to a temperature of from 1000° C. to 1100° C. A temperature of 1000° C. + 10° C. is preferred.

Figure 4:
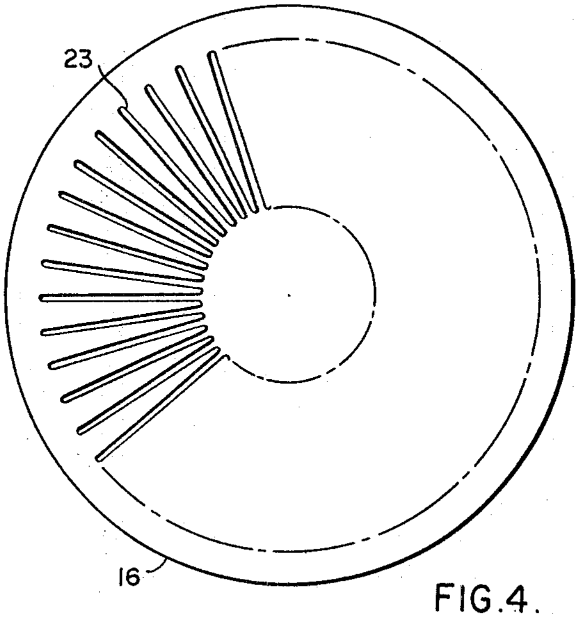
FIG. 4 is a top view of a semiconductor device showing a preferred emitter edge design.

A suitable masking agent, such for example, as one sold commercially under the trade name of Kodak Metal Etch Resist, is deposited on the layer 22. The design of a suitable base region is laid out on the surface of the silicon oxide layer 22 and exposed to light in a similar manner as one would make a print from a photograph negative. With reference to FIG. 4, there is shown a suitable design for a base region wherein an emitter edge 23 measures 21 inches in length and is suitable for employment in a 100 ampere device.

The masked silicon oxide layer 22 is then exposed to a slow etching solution such, for example, as a solution of 8 parts nitric acid, 3 parts acetic acid and 1 part hydrochloric acid. The undesired portion of the layer 22 is etched away, to expose a portion of the layer 18. The processed body 10 is then rinsed in water and placed in boiling trichloroethylene to remove the masking material.

Figure 5:
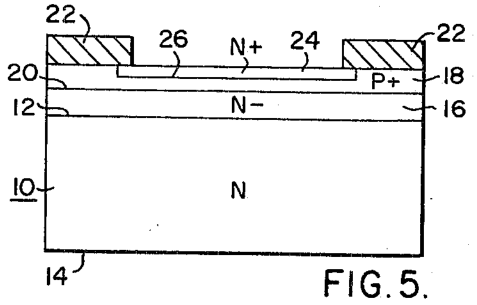
FIGS. 5 and 6 are views in cross-section of the body of semiconductor material shown in FIGS. 1, 2, and 3, being processed further in accordance with the teachings of this invention.

With reference to FIG. 5 the body 10 is placed in an open tube diffusion system to be diffused with an n-type material to form a region 24 of n+ semiconductivity in the epitaxial layer 18. Any suitable material which will achieve the semiconductivity type such, for example, as phosphorus oxychloride ($POCl_3$) may be employed. The diffused region 24 has a depth of from 3 to 4 microns and a resistivity of from 0.001 to 0.01 ohm-centimeter. A depth of 3 microns and a resistivity of from 0.001 to 0.01 ohm-centimeter is preferred. A p-n junction 26 is formed at the interface between the diffused region 24 and the epitaxial layer 18.

Referring now to FIG. 5, a suitable masking material is employed to assist in removing the unwanted remaining portion of the layer 22 of silicon oxide from a selected portion of the body 10. The unwanted oxide is removed by etching with hydrofluoric acid. The remainder of the layer 22 of silicon oxide is utilized to protect the exposed ends of the p-n junction 26 and to prevent shorting between electrical contacts to be mounted on the epitaxial layer 18 and the diffused region 24.

An electrical contact 28 is mounted on the bottom surface 14 of the body 10. The contact 28 comprises a material selected from the group consisting of molybdenum, tungsten, tantalum and base alloys thereof. A preferred material is molybdenum.

The contact 28 may be mounted on the surface 14 by any suitable solder such, for example, as by an ohmic solder consisting of 96 parts silver, 3 parts lead and one part antimony.

Electrical contacts 30 and 32 comprising any suitable electrically conductive metal such, for example as aluminum are deposited upon the epitaxial layer 18 and the diffused region 24 preferably by vacuum deposition. Suitable masking is required to orient the contacts on the respective surfaces of the layer 18 and the region 24 while preventing any contact material from being deposited on the remaining layer 22 of silicon oxide. Contact material inadvertently deposited on other surfaces than those desired are removed by selective etching. All extraneous contact metal is removed to prevent accidental shorting between regions of different type semiconductivity. The preferred aluminum contacts 30 and 32 are alloyed with the material comprising the layer 18 and the region 24 by heating the body 10 and its mounted contacts 30 and 32 to a temperature of approximately 600° C. for from one to two minutes.

All the exposed outer peripheral ends of the p-n junction 20 is suitably treated to remove impurities and the like which may degenerate the junction on the outer periphery. One suitable means to accomplish this end is to sandblast the peripheral edges of the p-n junction 20. The p-n junction 20 is then chemically etched and polished. To stabilize the treated p-n junction 20, a suitable protective coating 34, such, for example, as alizarin, is applied over the treated p-n junction 20.

Figure 6:
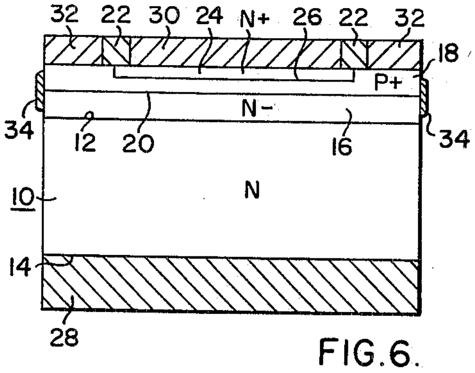

The results of an electrical evaluation of a 100 ampere, high power, high speed transistor made in accordance with the teachings of this invention are tabulated in Table I. The results were obtained by encapsulating the final structure of the processed body 10, shown in FIG. 6, in a compression bonded encapsulated unit wherein electrical connections to the contacts 28, 30 and 32 were maintained by compression means only.

The results repeatedly obtained show that these high power, high speed transistors have good electrical characteristics. They all exhibit good voltage and current gain.

Physical examination of the units disclosed the epitaxial layers to be free of defects such, for example, as poly inclusions, and tetrahedrals. This was true even when the impurity concentration of the layers grown was as high as $10^{19}$ atoms per cubic centimeter.

The good electrical characteristics of these transistors can be attributed to the in situ deposit of the p-n junctions by epitaxial growths on large area substrates. This virtually eliminates any handling required in the junction formation or exposure to a contaminating atmosphere. Accidental contamination from normal handling required in prior art techniques is eliminated and results in clean substantially defect-free junctions and surfaces.

The following is an example of the teachings of the invention:

Two slices of substrate material were prepared. Each substrate comprised silicon semiconductor material having a resistivity of 0.01 ohm-centimeter and n+ type semiconductivity. Each slice was approximately 1 inch in diameter. 3 mils of material was removed from each surface of the substrates on a rotary table by chemical polishing. The thickness of each slice before further processing was 6 mils.

One slice was heated in an epitaxial growth system to a temperature of 1175° C.±5° C. in a filtered dry atmosphere and etched with a mixture of hydrogen and pure gaseous hydrogen chloride for approximately 10 minutes. The slice was then held at temperature while hydrogen gas was flushed through the system for five minutes. A reactive gas mixture of hydrogen, silicon tetrachloride and phosphine was then caused to flow in the system. The flow of the reactant gas was continued for 20 minutes until an epitaxial growth, 20 microns in thickness and having a resistivity of 10 ohm-centimeter resulted.

The system was again flushed with hydrogen for 5 minutes while the slice remained at temperature. Upon completion of the hydrogen flushing, a reactant gas mixture was again introduced into the system. The reactant gas mixture was hydrogen, silicon tetrachloride and diborane. The reactant gas flow continued for 5 minutes until an epitaxial layer having 0.01 ohm-centimeter resistivity and being 5 microns in thickness had been grown on the previous epitaxial layer.

The slice was cooled to room temperature and immediately placed in an oxidation furnace. The slice was heated to a temperature of 1000° C. ±10° C. and held at a temperature while a gaseous mixture of oxygen and water vapor flowed about the slice and reacted to form a layer of silicon oxide, 3,000 A. in thickness, on the surface of the second epitaxial layer.

Figure 7:
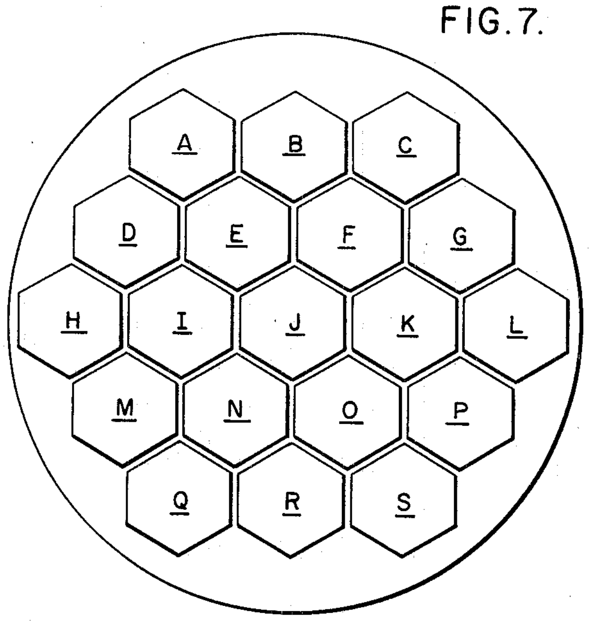
FIG. 7 is a planar view of a slice of semiconductor material showing the location of mesa structures made by processing the slice in accordance with the teachings of this invention.

The slice was then removed and employing a photoresist technique, 19 mesa structures were established on the silicon oxide layer. The arrangement of the mesas is shown in FIG. 7. The slice was then etched in a solution of 8 parts nitric acid, 3 parts acetic acid and 1 part hydrochloric acid until the p-n junction between the

TABLE I.—ELECTRICAL CHARACTERISTICS OF DOUBLE EPITAXIAL TRANSISTORS

| | 1 | 2 | 3 | | | | | 4 | 5 | 6 | 7 |
|---|---|---|---|---|---|---|---|---|---|---|---|
| | | | $h_{FE}$ | | | | | | | | |
| | $V_{CEO}$ volt/ma. | $V_{CBO}$ volt/ma. | 20A | 40A | 60A | 80A | 100A | $V_{CE(sat)}$ volt at 100A | $V_{CE(sat)}$ volt at 100A | $t$ on µs. | $t$ off µs. |
| 1 | 200/10 | 220/10 | 21 | 21 | 19.5 | 18 | 14 | 0.5 | 1.1 | 1.5 | 1.0 |
| 2 | 170/30 | 260/30 | 21 | 19 | 18 | 15 | 10 | 0.8 | 1.1 | 1.3 | 0.7 |
| 3 | 200/10 | 210/10 | 8 | | 6.5 | 6 | | 0.8 | 1.7 | 1.7 | 0.4 |
| 4 | 140/30 | 185/30 | 11 | | 9 | 8 | 8 | 1.2 | 1.35 | 1.7 | 0.6 |
| 5 | 100/30 | 125/50 | 20 | | 16 | 15 | 13 | 0.75 | 1.1 | 1.7 | 0.7 |

1. Collector to emitter breakdown voltage.
2. Collector to base breakdown voltage.
3. Current gain.
4. Collector to emitter saturation voltage.
5. Collector to emitter saturation voltage.
6. Turn-on time.
7. Turn-off time.

two epitaxial layers beneath the silicon oxide region was bared. The slice was cleaned and dried.

The second prepared slice was prepared by a prior art method of growing a first epitaxial layer followed by a diffusion process. Again 19 mesas were found on the processed slice for electrical comparison tests with the slice processed in accordance with the teachings of this invention.

All the mesa structures were tested electrically. The results are shown tabulated in Table II. The location on each slice of each mesa structure can be seen by correlation of the mesa number with the locations shown in FIG. 7.

TABLE II.—IV CHARACTERISTICS OF DIFFUSED AND EPITAXIAL P-N JUNCTIONS

| Mesa | Epitaxial-diffused junction, volt/ma. | Double-epitaxial junction, volt/ma. |
|---|---|---|
| A | 100/80 | 180/1 |
| B | 30/80 | 180/1 |
| C | 80/80 | 180/1 |
| D | 200/15 | 180/1 |
| E | 200/5 | 170/1 |
| F | 10/90 | 180/1 |
| G | 30/90 | 180/1 |
| H | 200/15 | 160/1 |
| I | 200/15 | 160/1 |
| J | 200/8 | 180/1 |
| K | 90/8 | 180/1 |
| L | 40/30 | 180/1 |
| M | 100/90 | 160/1 |
| N | 160/50 | 170/1 |
| O | 40/50 | 180/1 |
| P | 90/80 | 180/1 |
| Q | 6/80 | 160/1 |
| R | 36/90 | 170/1 |
| S | 32/90 | 170/1 |

The results tabulated clearly show the more uniform p-n junction structure which results from the double epitaxial layer growth on a large area substrate material.

Physical examination of the mesa structures showed the double epitaxial process procedure to have resulted in structures with apparently no polycrystalline material present in the epitaxial growths.

We claim as our invention:

1. A high amperage, high power, high speed three region semiconductor device comprising:

(1) a body of semiconductor material having opposed major surfaces comprising a bottom and a top surface, the body having a first type semiconductivity, and a resistivity of from 0.001 to 0.1 ohm-centimeter;

(2) a first epitaxial layer of semiconductor material grown on said top surface, said epitaxial layer having the same type semiconductivity as said body, a thickness of from 12 to 20 microns and a uniform resistivity of from 8 to 12 ohm-centimeter;

(3) a second epitaxial layer of semiconductor material grown on said first epitaxial layer, said second epitaxial layer having a second type semiconductivity, a thickness of from 3 to 5 microns and a uniform resistivity of from 0.08 to 0.15 ohm-centimeter;

(4) a first p-n junction formed at the interface of said first and said second epitaxial layers;

(5) a diffused region of first type semiconductivity formed in said second epitaxial layer, said diffused region having a thickness of from 3 to 4 microns and a resistivity of from 0.001 to 0.01 ohm-centimeter;

(6) a second p-n junction formed at the interface of said diffused region and said second epitaxial layer;

(7) a first electrical contact affixed to the bottom surface of said body;

(8) a second electrical contact affixed to the second epitaxial layer; and (9) a third electrical contact affixed to the diffused region.

2. The semiconductor device of claim 1 in which:

the first epitaxial layer has a thickness of 20 microns and a uniform resistivity of 10 ohm-centimer;

the second epitaxial layer has a thickness of 3–5 microns and a resistivity of 0.1 ohm-centimeter; and the region of first type semiconductivity in the second epitaxial layer has a thickness of 3–4 microns and a uniform resistivity of 0.01 ohm-centimeter.

3. The semiconductor device of claim 1 in which the body of semiconductor material on which the epitaxial layers are grown and each epitaxial layer comprises silicon.

4. The semiconductor device of claim 2 in which the body of semiconductor material on which the epitaxial layers are grown comprises silicon having a resistivity of 0.01 ohm-centimeter and each epitaxial layer comprises silicon.

5. The semiconductor device of claim 3 in which the electrical contact affixed to the region of first type semiconductivity formed in the second epitaxial layer has an outer peripheral edge length of approximately 21 inches.

6. The semiconductor device of claim 4 in which the electrical contact affixed to the region of first type semiconductivity formed in the second epitaxial layer has an outer peripheral edge length of approximately 21 inches.

References Cited

UNITED STATES PATENTS

| | | | |
|---|---|---|---|
| 3,326,729 | 6/1967 | Sigler | 148—175 |
| 3,271,208 | 9/1966 | Allegretti | 148—175 |
| 3,368,123 | 2/1968 | Rittmann | 317—235 |
| 3,210,621 | 10/1965 | Strull | 317—235 |
| 3,316,130 | 4/1967 | Dash | 148—175 |
| 3,370,995 | 2/1968 | Lowery | 148—175 |

JOHN W. HUCKERT, Primary Examiner

M. H. EDLOW, Assistant Examiner

U.S. Cl. X.R.

148—176